US012633502B2

(12) United States Patent
Züger

(10) Patent No.: US 12,633,502 B2
(45) Date of Patent: May 19, 2026

(54) ARC-BEAM SCANNING FOR SUPPRESSING ANODE OVERGROWTH IN PICVD SYSTEM

(71) Applicant: Oerlikon Surface Solutions AG, Pfäffikon, Pfäffikon (CH)

(72) Inventor: Othmar Züger, Triesen (LI)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 0 days.

(21) Appl. No.: 18/264,624

(22) PCT Filed: Feb. 9, 2022

(86) PCT No.: PCT/EP2022/053169
§ 371 (c)(1),
(2) Date: Aug. 8, 2023

(87) PCT Pub. No.: WO2022/171702
PCT Pub. Date: Aug. 18, 2022

(65) Prior Publication Data
US 2024/0304425 A1 Sep. 12, 2024

Related U.S. Application Data

(60) Provisional application No. 63/147,341, filed on Feb. 9, 2021, provisional application No. 63/147,345, filed on Feb. 9, 2021.

(51) Int. Cl.
| | |
|---|---|
| *C23C 16/52* | (2006.01) |
| *C23C 16/50* | (2006.01) |
| *H01J 37/32* | (2006.01) |

(52) U.S. Cl.
CPC ........ *H01J 37/32559* (2013.01); *C23C 16/50* (2013.01); *C23C 16/52* (2013.01);
(Continued)

(58) Field of Classification Search
CPC .................... H01J 37/32669; H01J 37/32055; H05H 1/50; C23C 14/0605; C23C 14/0611;
(Continued)

(56) References Cited

U.S. PATENT DOCUMENTS

| | | |
|---|---|---|
| 5,340,621 A | 8/1994 | Matsumoto et al. |
| 5,753,045 A | 5/1998 | Karner et al. |

(Continued)

FOREIGN PATENT DOCUMENTS

| | | | |
|---|---|---|---|
| EP | 3718964 | * | 7/2020 |
| EP | 3718964 A1 | | 10/2020 |
| WO | 03/031675 A2 | | 4/2003 |

OTHER PUBLICATIONS

Karner, J., et al., "High current d.c. arc (HCDCA) technique for diamond deposition", Diamond and Related Materials 5 (1996) 217-220.
(Continued)

*Primary Examiner* — Tabassom Tadayyon Eslami
(74) *Attorney, Agent, or Firm* — Chrisman Gallo Tochtrop LLC

(57) ABSTRACT

A method for suppressing anode overgrowth in an arc-beam PICVD coating system, wherein during at least part of a coating process of the arc-beam PICVD coating system, the arc-beam is scanned over at least part of a surface of the anode. Further, the invention relates to an arc-beam PICVD coating system for coating parts.

8 Claims, 6 Drawing Sheets

(52) U.S. Cl.
CPC .. *H01J 37/32055* (2013.01); *H01J 37/32541* (2013.01); *H01J 37/32669* (2013.01); *H01J 2237/3321* (2013.01)

(58) Field of Classification Search
CPC ... C23C 16/276; C23C 16/503; C23C 16/513; C23C 16/517; C23C 16/272; C23C 16/50; C23C 16/52
See application file for complete search history.

(56) References Cited

U.S. PATENT DOCUMENTS

| | | | | |
|---|---|---|---|---|
| 5,902,649 A | | 5/1999 | Karner et al. | |
| 7,192,483 B2 * | | 3/2007 | Franz .................... | C23C 16/276 |
| | | | | 423/446 |
| 2005/0016444 A1 * | | 1/2005 | Franz .................... | C23C 16/279 |
| | | | | 117/68 |

OTHER PUBLICATIONS

International Search Report and Written Opinion of International Application No. PCT/EP2022/053169, dated Jun. 15, 2022.

* cited by examiner

ARC-BEAM SCANNING FOR SUPPRESSING ANODE OVERGROWTH IN PICVD SYSTEM

A PICVD (plasma induced chemical vapor deposition) System based on a DC-Plasma Arc-Beam generated with an electron emission source (cathode) and a collector (anode) operated in a low pressure gas atmosphere typically in the range between 0.1 and 10 mbar. The gas mixture used in this process is composed of a noble gas like argon (Ar), hydrogen (H2) and a hydrocarbon gas. The hydrocarbon gas is the source of carbon atoms for the carbon based films to be grown, hydrogen is ensuring the growth to be in diamond sp3 carbon bonding mode, and Ar is necessary for operating the arc-beam plasma. This plasma-arc-beam is stabilized with a magnetic field with field lines forming a non-convoluted path from cathode to anode. Such a PICVD process to produce diamond films on parts is described in [1], [2], [3], [4], [5]. For simplicity, the cathode and anode are typically located on opposite side of a cylindrical reactor such that the arc-beam forms a straight column from cathode to anode (see FIG. 1a-c).

The magnetic field is generated by a coil (or multiple coils 10) arranged in such a way that field lines 10a are essentially parallel to the axis from cathode to anode and the field strength is approximately homogeneous.

In the hot plasma of the arc-beam, the hydrocarbon gas molecules are excited as well as atomic hydrogen is formed. These species diffusely migrate to the parts located at a distance from the arc-beam. On the surfaces of the parts, these species react to form a carbon film. For a properly chosen distance of the parts to the arc-beam, the temperature conditions are met for the efficient growth of diamond films.

In a PICVD System, coating film form from the excited species condensing on any surfaces. Those excited species migrate in a diffusely manner in the coating system. Depending on the surface temperature, different types of condensing reactions occur and different types of coatings grow on the surfaces. In a system for making diamond-type coatings, sp3-type diamond film growth occurs in the presence of appropriate amounts of atomic hydrogen at surfaces with temperatures in the range of 700-900° C. Heated both by thermal radiation from the plasma of arc-beam and by exothermal surface reactions, mainly of atomic hydrogen, those temperature conditions are met in a certain radial distance around the arc-beam in the center of the system. At larger distances, temperatures are lower and graphite type growth is favored. In areas with lower temperatures, especially on water cooled system walls, polymeric-type film growth is observed.

The diamond film growth rate on parts located at specific distances from the plasma arc-beam critically depends the distance from the center of the arc-beam. In a typical setup like shown in FIG. 1a, 1b the parts 1 are located at a fixed distance from the arc-beam axis 9.

In such a system, for stable operation of the arc-beam, an anode electrode with a cone shape to ensure axial symmetry is preferentially used, for ensuring a defined axis for the arc-beam on the center axis of the system. The electrons reaching the metallic surface of the anode are accelerated by a positive anode sheath potential. The corresponding gain in energy is then dissipated in the metallic anode surface. With a typical arc current of up to several 100 A, the power loss may arise to several Kilowatt (KW). The size of the anode surface needs to be properly designed in order to ensure enough cooling to avoid overheating and melting of the anode. With well designed water cooling channels inside the anode, power density levels in the range of over 100 W/cm² may be occurring on cone shaped anode surfaces. With the several kW total power losses in the anode, its surface area then must have several 10 cm². Since the current density in the arc-beam is highest at the center, the power density on the anode surface is also highest at its center and decreases with increasing radius. With increasing distance from the center of the anode, internal water cooling areas adjacent to the anode surface at a specific radius become much larger (quadratically larger with radius), while the power density from the arc-beam decreases to much smaller levels than in the center of the arc-beam. These two effects result in a strongly decreasing anode surface temperature towards the outer diameter. The anode in an arc-beam at the beginning of a coating process is shown in FIG. 2a. The arc-beam spreads over the entire metallic surface.

Given these facts, an insulating polymeric type film may grow on the anode where the surface temperature is lowest, especially with higher partial pressure of CxHy reaction gas or with lower arc currents. Starting initially on the outer circumference, this polymeric overcoat film is gradually growing onto the anode cone over time towards the center of the anode cone. An anode with such an overgrowth and the constricted arc-beam in vicinity of the anode is schematically shown in FIG. 2b.

Since such polymeric films are electrically insulating, the overgrown areas of the anode no longer contribute the effective area of the anode that conduct electrons from the arc-beam. Consequently, this active area of the anode decreases over time and, for a fixed discharge current preferred for the coating process, the power density on the still metallic anode surfaces rises and the deposited power loss is gradually concentrated to the tip region of the cone shaped anode. As a consequence, the power density is locally increased and consequently a locally higher heat load with higher temperature from the power loss. Additionally, this constriction of the beam may also increase the potential drop from the beam into the anode, resulting in even higher total power loss with constant arc current. Part of the additional power loss due to the higher potential at the anode results in a higher power loss onto the rest of the system, resulting in process temperature drifts, which may negatively affect process conditions for the film growth on the part's surfaces with impairment of the coating quality. Additionally, it has been observed that the center of the arc-beam may drift sidewise on the anode cone, which may have some adverse effects on the radial uniformity of the film growth on the parts arranged about the geometric axis of the system.

For achieving a higher coating rate, which is usually an economic benefit in coating applications, the process gas pressure may be increased as high as possible, usually limited by quality features for the desired film. However, with higher process pressure, the polymeric overgrowth on the anode becomes larger extending to the center, eventually also limiting the practically achievable coating rate in the system under production conditions.

A method to reduce or eliminate this overgrowth on the anode surface would be highly desirable that does not or only minimally affect the process condition chosen for obtaining coating films on the surface of the parts in the system.

This invention describes means and a method to suppress the formation of an insulating overgrowth film on the anode surface.

The aforementioned problem is solved by a method and system having the features of the claims.

Further measures improving the invention result from the following description of some embodiments of the invention, which are shown schematically in the figures. All features and/or advantages arising from the claims, the description or the drawings, including constructional details, spatial arrangements and process steps, may be essential to the invention both individually and in a wide variety of combinations. It should be noted that the figures are descriptive only and are not intended to limit the invention in any way.

DETAILED DESCRIPTION

Figure 1A:
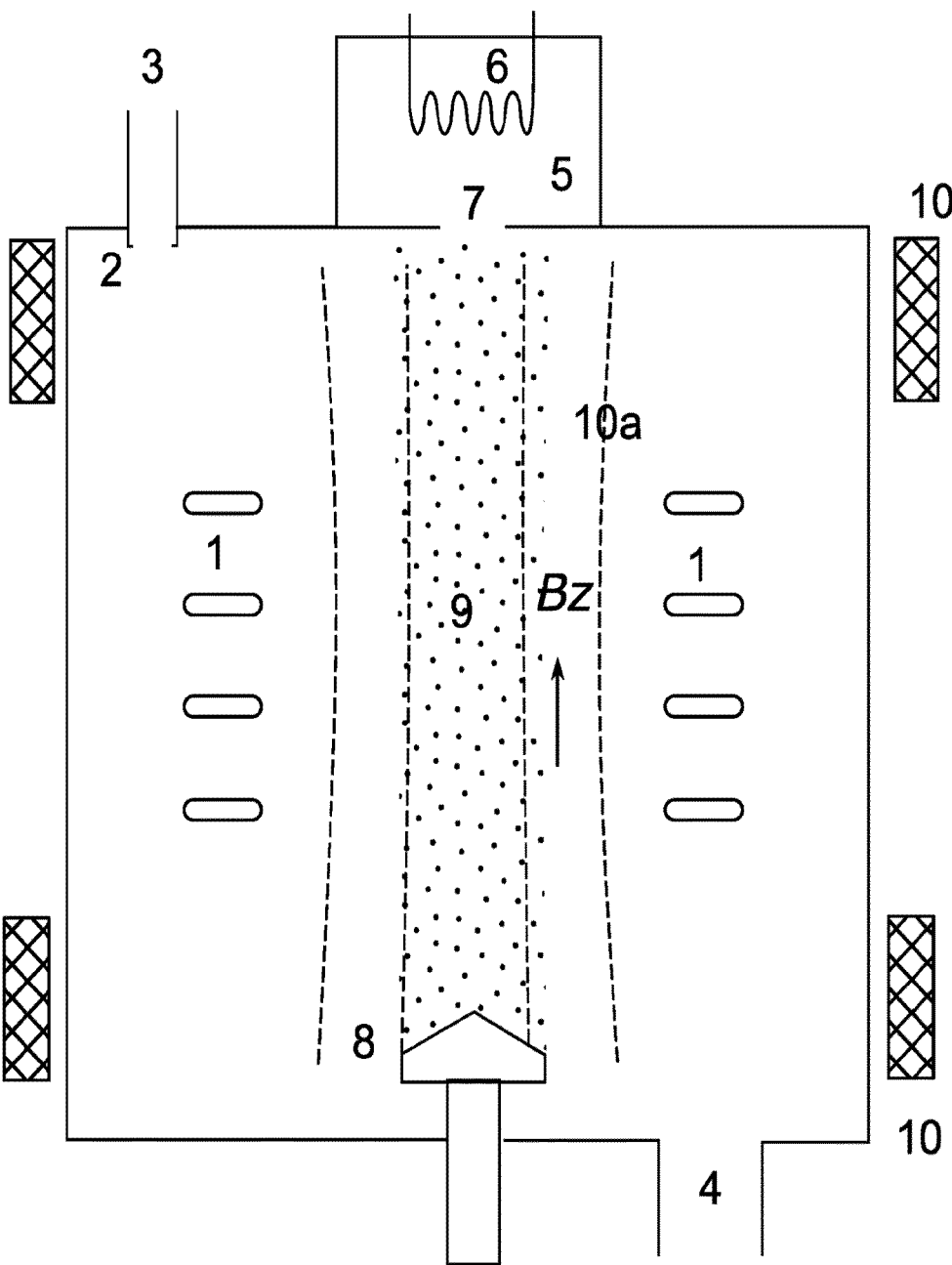
FIGS. 1a, 1b, and 1c show a PICVD system.
Figure 1B:
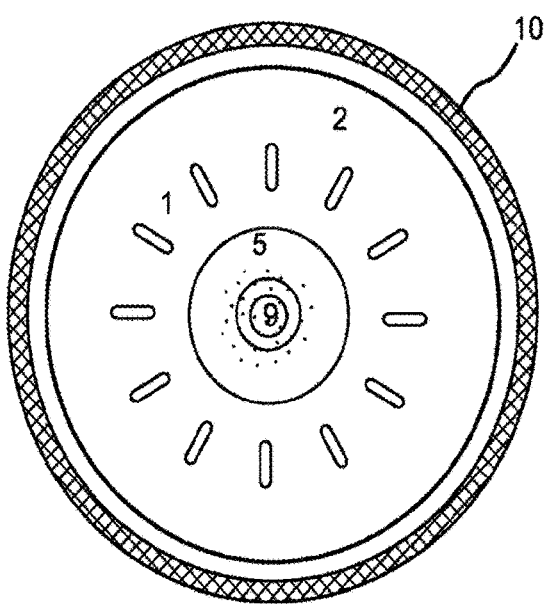
Figure 1C:
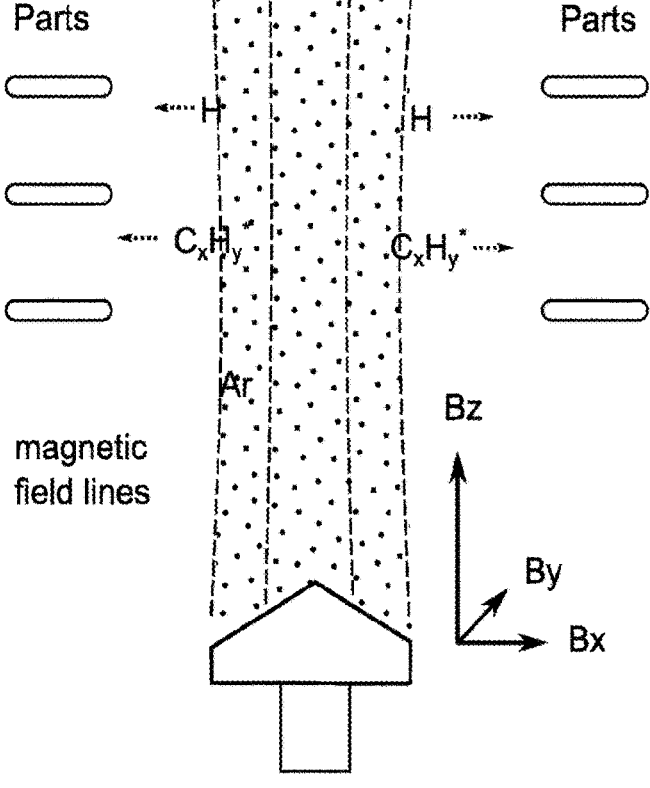
Figure 2B:
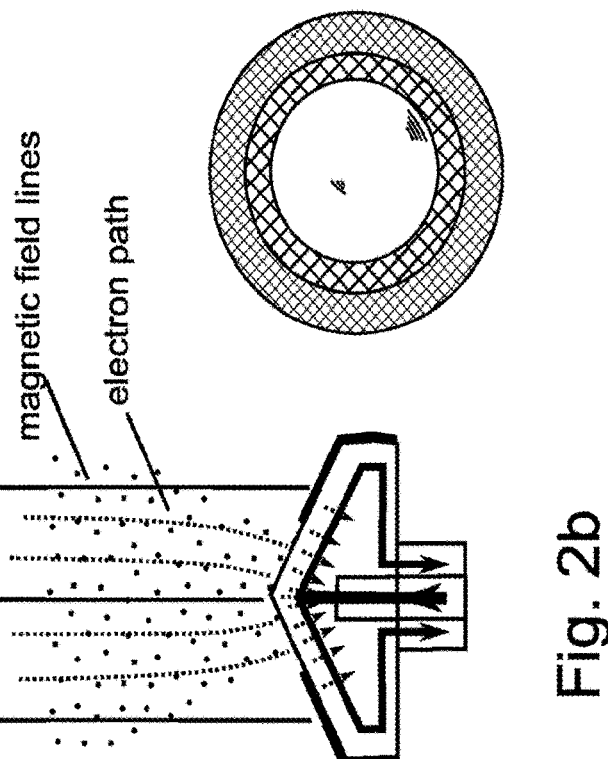
FIG. 2b shows schematically an anode with an overgrowth and a constricted arc-beam in vicinity of the anode.
Figure 2A:
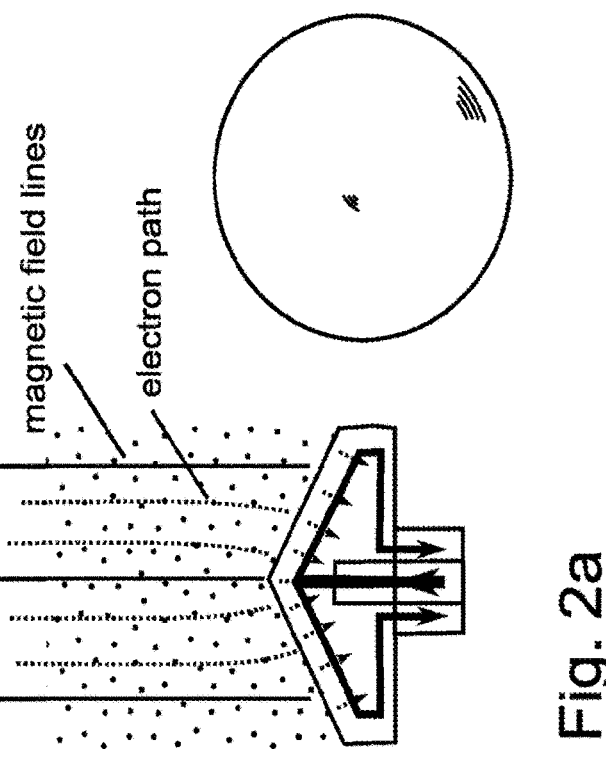
FIG. 2a shows an anode in an arc-beam at the beginning of a coating process.

According to the invention, a method for suppressing anode overgrowth in an arc-beam PICVD coating system is provided, wherein during at least part of a coating process of the arc-beam PICVD coating system, the arc-beam is scanned over at least part of a surface of the anode.

An anode overgrowth may comprise a layer of insulating components. As long as the anode overgrowth is very thin, it does not compromise the flow of electric current. A thick anode overgrowth can however restrict the flow of electric current to non-coated areas or areas with a thinner coating. An arc-beam PICVD coating system can comprise means to establish an arc-beam that is configured to deposit a coating on parts at low pressure by means of a plasma discharge. In the frame of the present invention, scanning of the arc-beam may be understood as a movement of the zone of the discharge which connects the plasma with the anode with reference to the anode. This movement may be continuous or vary in speed. The surface of the anode may be the actual whole surface of the anode or may be regarded as the part of the surface of the anode that—as long as it is not coated—is conducting the current of the arc-beam when there is no insulation on the anode deposited and the arc-beam is not moving. For example, the anode surface may essentially be the surface of the side of the anode that is facing the cathode.

The method steps can run at least partially simultaneously or chronologically one after the other, whereby the sequence of the method steps is not limited to the sequence defined by the numbering, so that individual steps can be carried out in different sequences.

It can be provided that the anode is essentially a rotational symmetric component and the arc-beam is scanned around the rotational symmetry axis. In other words, the anode may be essentially formed as a solid of revolution, wherein the arc-beam is moving around the central axis of the solid.

Also, it can be provided that in order to scan the arc-beam, two pairs of coils are used for creating oscillating magnetic field components perpendicular to the rotational symmetry axis, thereby attracting and/or deflecting the arc-beam and causing the oscillation. In other words, when the magnetic field lines parallel to the electric field between the cathode and the anode are denoted as being in a z-direction, magnetic fields in an x-y plane may be deflect the arc-beam in at least an x-direction or a y-direction. This provides the advantage that a large variety of scanning patterns can be achieved on the surface of the anode, so that a deposition of an insulating layer on the anode surface can be easily and effectively avoided or reduced.

It is conceivable that the scanning of the arc-beam is controlled by a magnetic field, wherein at least a strength or a direction of the magnetic field is set based on an expected growth of an insulating layer on the anode. In other words, is can be provided that areas where a large growth would be expected if the arc-beam was not moved on the anode surface are subjected to the arc-beam for a longer time during the deposition process by setting up a magnetic field which controls the form and motion of the arc-beam. This provides the advantage that the surface of the anode can be subjected to the arc-beam as necessary, so that a deposition of an insulating layer on the anode surface can be easily and effectively avoided or reduced.

It can be provided that the scanning of the arc-beam follows an elliptic path on the anode. In other words, an oscillation on an x-axis differs from the amplitude from an oscillation on the y-axis, provided that the z-axis is defined along the path between the anode and the cathode. An elliptic path provides the advantage that non-circular overgrowth patterns can be avoided efficiently.

Advantageously, it can be provided that the scanning of the arc-beam is follows a closed path on the anode. A closed path can e.g. be easily realized by oscillating magnetic fields, so that Lissajous-like patterns can be formed on the surface of the anode.

Also, it can be provided that an amplitude of an arc-beam path modulation is between a tenth and a fifth of the diameter of the anode. This motion range effectively reduces the deposition of an insulating layer on the anode of the surface.

It is further conceivable that the whole surface of the anode is subjected to the arc-beam at least once during the coating process. In particular, the whole surface should be understood as the whole surface of the anode that is usually subject of being coated by an insulating layer. In case that the anode surface is at least partly masked, e.g. by holders, the whole surface is supposed to be the non-masked region. This way, a deposition of an insulating layer can be effectively suppressed on the whole surface of the anode.

Also, it is possible that during the coating process, the arc-beam is directed to areas of the surface of the anode where a larger deposition of an insulating layer on the anode is expected without scanning the arc-beam for a longer time in comparison where a where a lower deposition of an insulating layer on the anode is expected without scanning the arc-beam. It can be provided that the expected deposition pattern is reciprocally feed into the control of the arc-beam scanning, so that the reduction of deposition of the insulating layer is improved with every loop.

In a further aspect of the present invention, an arc-beam PICVD coating system for coating parts is provided, wherein the arc-beam PICVD coating system is configured to carry out a method according to the invention.

Thus, a system according to the invention brings the same advantages as have been described in detail with reference to a method according to the invention.

Further features and details of the invention result from the dependent claims, the description and the drawings. Features and details which have been described in connection with the method according to the invention naturally also apply in connection with the system according to the invention and vice versa in each case, so that with regard to the disclosure concerning the individual aspects of the invention reference is or can always be made mutually.

The basic idea is a controlled cyclic motion of the arc-beam over the entire area of the anode surface. Although initial ultrathin overgrowth may be formed on the surface areas that temporarily are not within the arc-beam during one motion cycle, all parts of the surface area are successively within the arc-beam in the course over a complete motion cycle. The overcoat on these areas remain thin enough that insulating properties that suppress electron conduction cannot evolve. A slightly reduced conduction through these ultrathin layers may give rise to a small additional voltage drop of the arc-beam when it is moved over these areas later during the motion cycle. This voltage drop leads to an additional power loss, with the consequence of a local surface temperature increase. This makes this overcoat layer to evaporate or disintegrate, leaving the area as a metallic surface after the arc-beam has passed this section of the anode. With the cyclic motion over the entire anode, the surface remains in a conductive state and no constriction of the arc-beam at the anode occurs.

Figure 3:
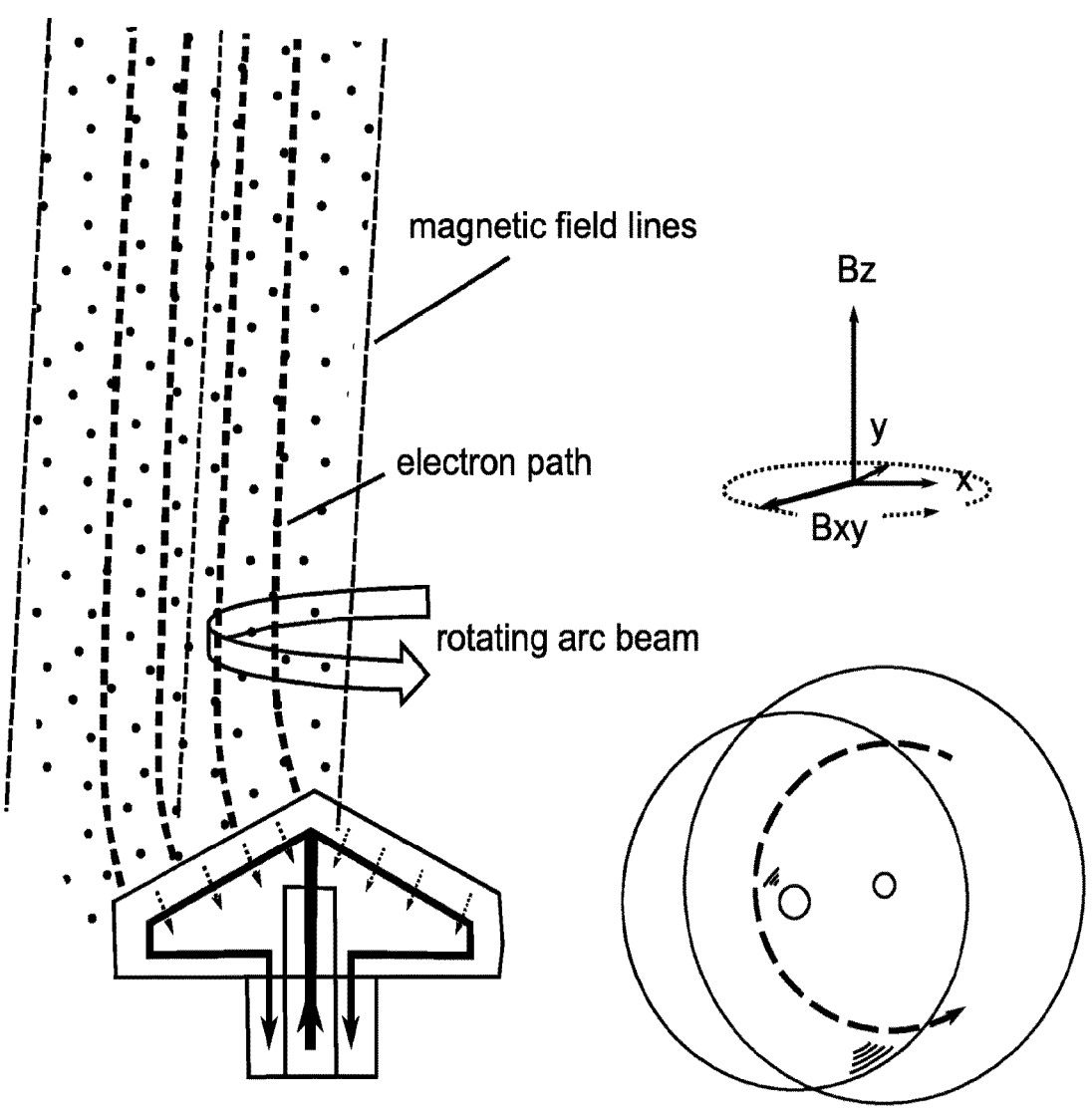
FIG. 3 shows a circular motion of the arc-beam about the central axis of the anode.
Figures 4A, 4B:
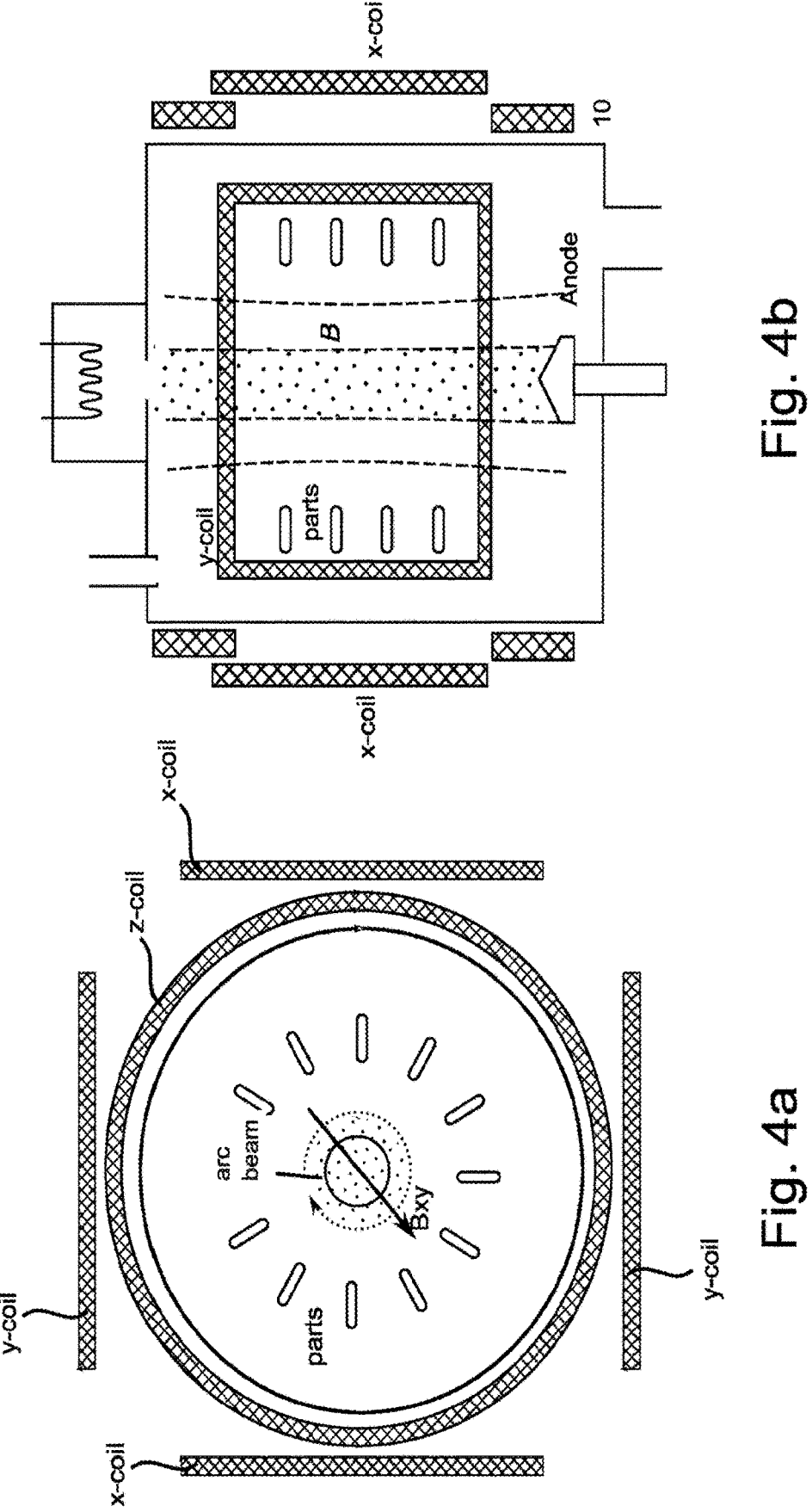
FIG. 4a shows a top view and FIG. 4b shows a side view of a set of coils outside of the coating system chamber which generate an in plane magnetic field component for deflecting the arc-beam.

Given the rotational symmetry of the anode, the cyclic motion pattern may be a circular motion of the arc-beam about the central axis of the anode, which is schematically shown in FIG. 3. The circular path of the arc-beam motion can be achieved by a set of coils outside of the coating system chamber which generate an in plane magnetic field component for deflecting the arc-beam. FIG. 4a shows a top view and FIG. 4b shows a side view of such a system. Preferentially, two pairs of coils on opposite side of the system are used for generating the magnetic field component in x- and y-direction.

With properly modulated currents in these coils, a horizontal magnetic field vector Bxy is generated that is rotating in its direction in the horizontal plane about the center axis of the system. The same rotating field vector can also be achieved if the coils are not perpendicular, just by adapted amplitudes of the individual coil currents and corresponding phase relation.

The diameter of the path is adjusted to minimize or eliminate the overgrowth layer on the anode growing from the outer diameter towards the center. The diameter of the rotation but not too large such that the arc-beam is distorted and negatively affecting the stable coating process. If a non-circular overgrowth should occur with a static arc-beam, an elliptic path with its axis adjusted to the overgrowth pattern can simply be generated by appropriate modulation of the currents of the horizontal coils. If the overcoat is not centered on the anode axis, appropriate static offset currents may be applied to the coils to statically deflect the arc-beam onto the anode center.

The corresponding current signals for a modulation period Tp=1/f and f as the modulation frequency to the x- and y-coils may be written as:

$$Ix = Isx + Imx \cdot \cos(2 \cdot \pi \cdot f \cdot t)$$

$$Iy = Isy + Imy \cdot \sin(2 \cdot \pi \cdot f \cdot t + \varphi)$$

where Isx, Isy are fixed offsets for centering the arc-beam on the anode, Imx, Imy are modulation amplitudes and φ is a phase angle to generate a specific direction of an elliptic path. The deflection of the arc-beam with a specific coil current is determined by the geometry of the system and the coils, and the field strength of the axial field for arc-beam stabilization.

The period of the modulating should be chosen short enough that the overgrowth formation during one period remains ultrathin with still conducting properties.

Estimated from experiments with a static arc-beam, the overcoat layer thickness might typically be in the few 10 μm-range after several hour processes. Consequently, the overcoat growth rate may be on the level less than a nanometer per second. With a modulation period lasting not more than a few 10 seconds, the ultrathin overcoat layer remains on a level of only a few nm, which is still conducting enough that electrons of the arc-beam can reach the anode.

The cyclic motion of the arc-beam might unintentionally influence the growth rate of the desired diamond film on the parts positioned around the arc-beam column. The growth rate of the films on the parts depends on the distance of from the arc-beam axis, becoming larger/smaller with decreasing/increasing distance from the beam axis. With the arc-beam rotating about the system axis (which coalesce with the static arc-beam axis), the growth rate on the parts surfaces gets modulated with the rotation frequency of the circular motion of the beam. As long as this modulation is small compared to the growth rate with static arc-beam, and the number of modulation cycles of an entire coating process is large, these modulations minimally affect the film formation and the overall thickness remains unaffected, because the growth variations from modulation cycles averages out over the large number of modulation cycles. Additionally, with specific non-sinusoidal modulation schemes, the overgrowth growth on the anode could still be suppressed while the thickness variations on the parts is minimized to a better degree in a case where sinusoidal modulation would leave some variations.

In typical examples, the anode diameter may be on the order of 50-100 mm. Initially the arc-beam spreads over the entire area of the anode. Overtime with static arc-beam, depending on process conditions like partial pressure of C-containing gas, overall pressure and arc-beam current levels, an overcoat may grow from the outer diameter of the anode to a ring with inner diameter of less than half the anode diameter, leaving a metallic area on the anode of less than ¼ of the total anode area at the beginning of the process. With an arc-beam modulation amplitude of typically 10 mm, the overgrowth area can be reduced to only a small rim at the outer diameter of the anode, leaving almost the entire anode surface metallic. Since there is some increase in discharge voltage with increased modulation amplitude, the choice of the modulation amplitude is a compromise between elimination of overgrowth and potentially affecting other process parameters in a manner that might be disadvantageous to the film production process.

Figures 5, 6:
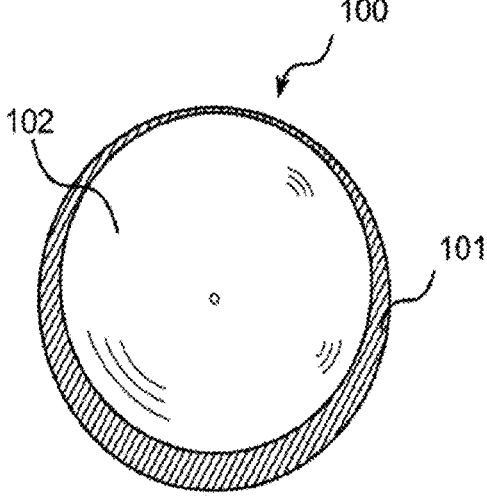
FIG. 5 shows a result of a coating process using a method and a system according to the invention have been used.
FIG. 6 shows the result of a coating process without the usage of a method and a system according to the invention.

FIG. 5 and FIG. 6 illustrate the effect of a method and a system according to the invention. Both figures are a schematic top view of photographs showing a conically shaped anode (100) that has been used in a coating process. In FIG. 5, the method and a system according to the invention have been used, whereas FIG. 6 shows the result of a coating process without the usage of a method and a system according to the invention. As can be seen, the overgrown area (101) in FIG. 5 is much smaller in comparison according to the method and the system according to the invention. It should be noticed that the thickness of the insulating layer on the anode (100) is larger without the use of a method and a system according to the invention (not illustrated in the figures). In particular, when during at least part of a coating process of the arc-beam PICVD coating system, the arc-beam is scanned over at least part of a surface of the anode (100), a large uncovered area (102) remains after the coating process is completed.

The foregoing explanation of the embodiments describes the present invention exclusively in the context of examples. Of course, individual features of the embodiments can be freely combined with each other, provided that this is technically reasonable, without leaving the scope of the present invention.

[1]: Karner, Pedrazzini, Bergmann, U.S. Pat. No. 5,753,045
[2]: "High current d.c. arc (HCDCA) technique for diamond deposition", J. Karner, M. Pedrazzini, C. Hollenstein, Diamond and Related Materials 5, (1996), 217-220
[3]: "Verfahren zur Diamantbeschichtung", D. Franz, J. Karner, WO 03/031675 A2
[4]: Franz, Karner, U.S. Pat. No. 7,192,483
[5]: Karner, Pedrazzini, Bergmann, U.S. Pat. No. 5,902,649

What is claimed is:

1. A method for suppressing anode overgrowth in an arc-beam PICVD coating system, wherein during at least part of a coating process of the arc-beam PICVD coating system, the arc-beam is scanned over at least part of a surface of the anode, wherein the scanning of the arc-beam is controlled by a magnetic field, and wherein at least a strength or a direction of the magnetic field is set based on an expected growth of an insulating layer on the anode.

2. The method according to claim 1, wherein the anode is essentially a rotational symmetric component and the arc-beam is scanned around the rotational symmetry axis.

3. The method according to claim 1, wherein in order to scan the arc-beam, two pairs of coils are used for creating oscillating magnetic field components perpendicular to the rotational symmetry axis, thereby attracting and/or deflecting the arc-beam and causing the oscillation.

4. The method according to claim 1, wherein the scanning of the arc-beam follows an elliptic path on the anode.

5. The method according to claim 1, wherein the scanning of the arc-beam follows a closed path on the anode.

6. The method according to claim 1, wherein an amplitude of an arc-beam path modulation is between a tenth and a fifth of the diameter of the anode.

7. The method according to claim 1, wherein the whole surface of the anode is subjected to the arc-beam at least once during the coating process.

8. The method according to claim 1, wherein during the coating process, the arc-beam is directed to areas of the surface of the anode where a larger deposition of an insulating layer on the anode is expected without scanning the arc-beam for a longer time in comparison where a lower deposition of an insulating layer on the anode is expected without scanning the arc-beam.

* * * * *